Sept. 14, 1937. M. D. McINTOSH Re. 20,503
METHOD OF PRODUCING DRAWINGS OR OTHER COMPOSITIONS
Original Filed Feb. 11, 1935
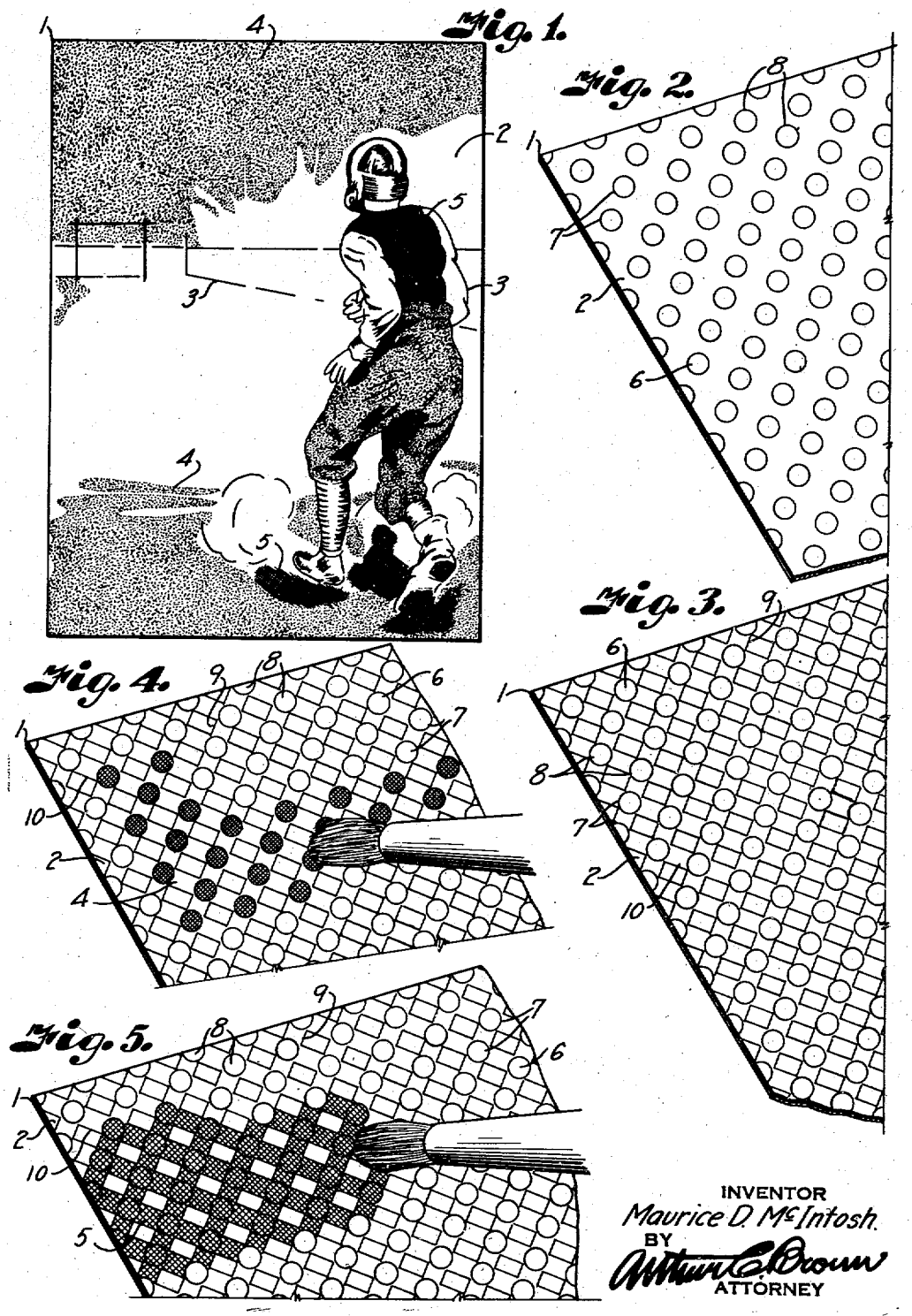
INVENTOR
Maurice D. McIntosh
BY
Arthur C. Brown
ATTORNEY Reissued Sept. 14, 1937 Re. 20,503

UNITED STATES PATENT OFFICE 20,503

METHOD OF PRODUCING DRAWINGS OR OTHER COMPOSITIONS

Maurice D. McIntosh, Marion, Kans., assignor to Louis S. Sanders, Cleveland, Ohio Original No. 2,038,516, dated April 21, 1936, Serial No. 5,948, February 11, 1935. Application for reissue June 22, 1937, Serial No. 149,681

25 Claims. (Cl. 41—41)

This invention relates to a method of producing drawings or other compositions, particularly for use as copy in the production of line etchings. In the preparation of drawings for line etchings, it is desirable to show various sections or parts of the drawing in various shades or tones, however, pluralities of shades or color tones in Ben Day effects cannot be conveniently drawn by an artist.

It is, therefore, the principal object of the present invention to provide means whereby various shades and shadows or color tones can be provided on line drawings and reproduced in line etchings.

In accomplishing this and other objects of the invention, as hereinafter pointed out, I have provided a novel drawing surface and technique as illustrated in the accompanying drawing, wherein:

Fig. 1 is a perspective view simulating a drawing produced in accordance with the present invention.

Fig. 2 is a fragmentary perspective view of a drawing paper, particularly illustrating the first step in preparing the drawing surface, which step produces an invisible pattern for one of the tone shades to be reproduced on a drawing.

Fig. 3 is a similar view of the drawing paper after the pattern for a second tone shade has been applied.

Fig. 4 is a view of the paper illustrating the step of rendering visible selective areas of one of the patterns to produce a tone shade of one value.

Fig. 5 is a similar view of the step in rendering the patterns collectively visible to produce a tone shade of a second or darker value.

Referring more in detail to the drawing:

1 designates a sheet of paper, cloth or other substance having a surface 2 on which a line drawing can be produced as in conventional practice, for example the pen lines as indicated at 3 in Fig. 1.

Heretofore in the preparation of such drawings for reproduction by line etchings, it was impossible for the artist to conveniently draw a plurality of high light effects on the drawing as indicated by the light and dark areas 4 and 5 respectively.

In the present instance, however, I have provided the drawing surface with a plurality of invisible Ben Day patterns capable of being rendered successively or collectively visible by the artist, to produce the desired shades 4 and 5 and which are susceptible to reproduction in the form of line etchings as now to be described.

To prepare the drawing surface, the first pattern may consist of a plurality of geometrically arranged figures or dots 6 which in the present instance are shown as located in equally spaced diagonal rows 7 in such a manner that the dots in one of the rows 7 align with adjacent dots in the other rows to form diagonal rows 8 extending transversely of the rows 7.

In other words, the center of any four adjacent dots produces the corners of a square, the sides of which are the intersecting center lines for the respective diagonal rows of dots. These dots are printed with a compound which, when dry and subject to a later treatment, are substantially invisible and not susceptible to photographic reproduction, but are adapted to be rendered visible upon application of a suitable developer as later described.

After the first pattern consisting of the dots has been printed on the paper, a second pattern is applied which may consist of diagonal lines 9 and 10 extending longitudinally of and in registry with the respective diagonal rows of dots as illustrated in Fig. 3. This second pattern is printed upon the paper with a compound which, when dry and subject to treatment, is invisible on the surface of the paper in the same manner as the first pattern.

I have found that a suitable printing compound for the first pattern may be prepared by mixing a solution of mercurous nitrate ($HgNO_3$) and glycerin wherein the glycerin acts merely as a vehicle to carry the mercurous nitrate onto the drawing surface.

The second pattern consisting of the lines is formed by a compound of lead nitrate ($Pb(NO_3)_2$) mixed in solution with glycerin.

After the patterns have been respectively printed on the paper with the mercurous nitrate and lead nitrate solutions, the paper is allowed to dry. Both of these compounds when dry are not perceptibly visible on the drawing surface and do not interfere with application of the lines 3, nor do they affect the portions of the drawing to be left the color of the paper background.

In order to render the imprinted patterns selectively or collectively visible, I provide developers which react selectively or collectively with the two compounds to precipitate the mercury and lead ions without in any way altering the imprinted patterns. In other words, one of the developing solutions must render the dots visible without visibly reacting with or dissolving the compound forming the lines.

To render the patterns collectively visible, to give the second or darker tone, a developer must be used which will react with the compounds forming both the dots and lines.

In preparing the imprinted patterns for reaction with the developers, I have found that it is necessary to change the mercurous nitrate to a white insoluble mercurous compound and the lead nitrate to a white insoluble lead compound, such as mercurous chloride and lead sulphate, respectively. This may be accomplished by subjecting the paper to the action of hydrogen chloride gas for about fifteen seconds in which time the mercurous nitrate is changed to insoluble mercurous chloride ($HgCl$) and the lead nitrate to lead chloride ($PbCl_2$), but the imprinted patterns have not been changed in physical form.

The next step is to change the lead chloride to insoluble lead sulphate ($PbSO_4$) without impairing the mercurous chloride. This is accomplished by immersing the paper in a dilute sulphuric acid or sodium bisulphate solution. The mercurous chloride which has already been precipitated by the gas is insoluble in the sulphuric acid solution and remains unimpaired. The lead chloride, however, is changed to insoluble lead sulphate ($PbSO_4$).

The paper is then removed from the acid solution and washed in cold water, after which it is allowed to dry. The excess mercurous chloride and lead sulphate extending above the surface of the sheet is then removed by light buffing or other similar means.

The sheet now holds two relatively printed invisible patterns, the first consisting of mercurous chloride and the second of lead sulphate and is ready for use by the artist.

When colored compounds of lead and mercury are used such as basic lead chromate and mercurous chromate in the printing step, the patterns are, of course, visible; but as soon as the paper is treated with the gas and acid solution, the resulting reaction leaves lead sulphate and mercurous chloride. These compounds are the same as those resulting when lead and mercurous nitrates are employed and are colorless.

When the drawing is to be prepared by the artist, the ink lines 3 will be applied in the usual manner, but to obtain the light shades 4 he will develop the pattern comprising the dots and to obtain the dark shades 5 he will collectively develop both patterns including the dots and lines by developing solutions as now to be described.

In developing the dotted patterns to produce the light shades, the pattern comprising the lines must be left invisible and unimpaired by the developing agent. I have found that a developing agent which will react with the mercurous chloride forming the dots, but not with the lead sulphate can be produced by preparing a six percent solution of ammonium hydroxide ($NH_4OH$). This solution when applied to the selective areas to be produced in light shades will develop the dots by changing the mercurous chloride to a mercuric amine, which appears as a black image of the invisible dots. The black precipitate is insoluble in excess of precipitating agent or developer and remains entirely in its imprinted form.

Since the chemical forming the diagonal lines is insoluble in the ammonium hydroxide, it remains invisible and unimpaired by the developer, but is capable of subsequent development by a second developing solution to produce a second or darker tone as indicated at 5 in Fig. 1.

Since the design which gives the dark tone, indicated in Fig. 3 is not complete in itself because of interlineation of the dots, it is necessary to provide a developer which simultaneously develops the dots and lines.

This is accomplished by a developer solution, for example a soluble sulphide, such as sodium, lithium, calcium or barium, which causes precipitation of both the mercury and lead of the imprinted compounds in the form of black sulphides, thereby rendering both patterns visible in the areas that are treated with the sulphide solution.

It is here noted that it may be desirable for the artist to render the pattern illustrated in Fig. 3 visible in areas where the dots have been previously developed to make the darker shade as indicated in Fig. 5 and this may be accomplished by going over the previously developed areas with the sulphide reagent which will then develop the latent design comprising the lines. This makes it possible to produce at will on any part of the drawing surface, a design resembling the light value of half-tone shading and also a second design resembling a darker value of half-tone shading although the darker shading is a combination of both patterns.

While I have found the compounds above noted to be most practicable, the designs may be imprinted with other compounds; for example the dots with mercurous nitrate and the second pattern comprising the lines with bismuth chloride ($BiCl_3$) which are both hydrolyzed to insoluble basic salts by the action of steam. The developing reagent for the first pattern can be a solution of ammonium hydroxide, a dilute solution of thiourea ($NH_2CSNH_2$) or a dilute caustic alkali. These solutions precipitate mercuric amine, mercuric sulphide, and mercurous oxide, respectively, and leave the compound composing the other pattern invisible and insoluble. The second developer for both patterns may consist of a solution of soluble sulphide which precipitates both black mercuric sulphide and black or brown bismuth sulphide.

From the foregoing it is apparent that I have provided a drawing paper whereon line drawings may be prepared and provided with a plurality of shaded surfaces which, due to their geometrical character, may be reproduced in line etchings.

What I claim and desire to secure by Letters Patent is:

1. The method of producing copy used in producing line etchings, including making a drawing upon a surface having a plurality of invisible patterns imprinted upon said surface with individual compounds, applying a developer solution capable of reaction with only one of said compounds to selected portions of the drawing to develop portions of one pattern, and applying a developer capable of reacting with both compounds to selected portions of the drawing to develop portions of both patterns.

2. The method of producing drawings including making a drawing upon a surface having a plurality of invisible patterns respectively formed upon said surface with insoluble mercurous and lead compounds, applying an ammonium hydroxide solution capable of reaction with said mercurous compound to selected portions of the drawing to develop portions of one pattern, and applying a soluble sulphide solution to selected portions of the drawing to develop portions of both patterns.

3. The method of preparing a drawing paper and the like having a drawing surface including printing an invisible pattern on said surface with a soluble compound, printing a second invisible pattern on the paper with a second soluble compound, and treating the imprinted compounds with a gas to convert said imprinted compounds into invisible and insoluble imprinted compounds chemically developable to form visible patterns.

4. The method of preparing a drawing paper and the like having a drawing surface including printing a Ben Day pattern on said paper with a colored mercurous compound, printing a second Ben Day pattern on the paper with a colored lead compound, treating the paper with hydrogen chloride gas to convert said compounds into insoluble white mercurous and lead chlorides, subjecting the paper to an acid solution to convert the lead chloride to white lead sulphate, and finally washing the paper of said acid solution.

5. The method of preparing a drawing paper including forming a photographically invisible pattern on the paper with an insoluble mercurous compound, and forming a second photographically invisible pattern on the paper with an insoluble lead compound, said invisible patterns being chemically developable to form photographically visible designs.

6. The method of preparing a drawing paper including forming a photographically invisible pattern on the paper with an insoluble mercurous compound, and forming a second photographically invisible pattern on the paper with an insoluble bismuth compound, said invisible patterns being chemically developable to form photographically visible designs.

7. The method of preparing a drawing paper including forming a pattern on the paper with a mercurous compound forming a second pattern on the paper with a lead compound, treating the paper with hydrogen chloride gas to convert said compounds to mercurous and lead chlorides, treating the paper with a sulphuric acid solution to convert the lead chloride to lead sulphate, and washing the paper to remove the acid solution.

8. The method of preparing a drawing paper including forming a pattern on the paper with a mercurous compound, forming a second pattern on the paper with a lead compound, treating the paper with hydrogen chloride gas to convert the compounds to chlorides, and treating the paper with a soluble bisulphate solution to convert the lead chloride to lead sulphate.

9. The method of preparing a drawing paper including forming a pattern on the paper with a mercurous compound, forming a second pattern on the paper with a lead compound, treating the paper with hydrogen chloride gas to convert the compounds to mercurous and lead chlorides, treating the paper with a sulphuric acid solution to convert the lead chloride to lead sulphate, washing the paper to remove the acid solution, drying the paper, and buffing off excess portions of the chemicals remaining on the paper.

10. The method of preparing a drawing paper including forming an invisible pattern on the paper with a mercurous nitrate, forming a second pattern on the paper with a lead nitrate, treating the paper with hydrogen chloride gas to convert the compounds to chlorides, and treating the paper with a soluble bisulphate solution to convert the lead chloride to lead sulphate.

11. The method of preparing a drawing paper including forming a pattern on the paper with a mercurous chromate compound, forming a second pattern on the paper with a lead chromate compound, treating the paper with hydrogen chloride gas to convert the compounds to chlorides, and treating the paper with a soluble bisulphate solution to convert the lead chloride to lead sulphate.

12. The method of preparing drawings including making a drawing upon a surface having a plurality of invisible patterns imprinted upon said surface with individual compounds, applying a developer solution over all of said compounds and capable of reaction with only one of said compounds to selected portions of the drawing for developing portions of one pattern, and applying a developer capable of reacting with said first named compound and with another of said compounds to selected portions of the drawing for developing portions of both patterns.

13. A method of preparing drawing paper of the character described including printing a plurality of normally invisible patterns on a paper sheet one consisting of geometrically spaced figures printed by one compound and another of figures printed by a different compound and having definite registry relatively to said first named figures, said first compound being capable of development by a developer which does not develop the second compound and also by a second developer capable of developing said second compound.

14. A drawing paper having a plurality of normally invisible patterns one consisting of geometrically spaced figures printed by one compound and another of figures printed by a different compound and having definite registry relatively to said first named figures, said first compound being capable of development by a developer which does not develop the second compound and also by a second developer capable of developing said second compound.

15. A drawing paper having a plurality of normally invisible patterns one consisting of geometrically spaced dots printed by one compound and another consisting of spaced lines printed on said paper with another compound in registering alignment with said dots, the compound forming the dots being capable of development by a developer which does not develop the compound forming the lines and also by a second developer capable of developing the compound forming said lines.

16. A drawing paper having a plurality of normally invisible patterns capable of development into visible patterns one consisting of geometrically spaced dots printed by one compound and another of spaced lines printed on said paper with another compound in definite arrangement relatively to said dots whereby said dots are incorporated into portions of said lines, said compound forming the dots being capable of development by a developer which does not develop the compound forming the lines and also by a second developer capable of developing the compound forming the lines.

17. The method of producing copy used in producing line etchings, including making a drawing upon a surface having a plurality of invisible patterns thereon, applying a developer solution capable of developing only one of said patterns to render portions of said pattern visible, and applying a developer capable of developing both patterns to render portions of both patterns visible.

18. The method of producing drawings including making a drawing upon a surface bearing a plurality of invisible patterns respectively containing mercury and lead compounds, applying a solution capable of reaction with said mercury compound to selected portions of the drawing to develop portions of one pattern, and applying a solution to selected portions of the drawing to develop portions of both patterns.

19. The method of preparing a drawing paper and the like having a drawing surface including forming an invisible chemically developable pattern on said surface consisting of one compound, and forming a second invisible chemically developable pattern on said surface consisting of a second compound, said first pattern being developable by a developer which will not affect the second pattern, and said second pattern being developable by a developer which will develop both patterns.

20. The method of preparing a drawing paper including forming a photographically invisible pattern on the paper containing a mercury compound, and forming a second photographically invisible pattern on the paper containing a lead compound, said invisible patterns being chemically developable to form photographically visible designs, said first pattern being developable by a developer which will not affect the second pattern, and said second pattern being developable by a developer which will develop both patterns.

21. The method of preparing drawings including making a drawing upon a surface bearing a plurality of invisible patterns containing individual compounds, applying a developer solution over all of said compounds and capable of reaction with only one of said compounds to selected portions of the drawing for developing portions of one pattern, and applying a developer capable of reacting with said first-named compound and with another of said compounds to selected portions of the drawing for developing portions of both patterns.

22. A method of preparing drawing paper of the character described including forming a plurality of normally invisible patterns on a paper sheet, one consisting of geometrically spaced figures formed of one compound and another of figures formed of a different compound and having definite relation to said first-named figures, said first compound being capable of development by a developer which does not develop the second compound and also by a second developer capable of developing said second compound.

23. The method of preparing a drawing paper and the like having a drawing surface, including forming a plurality of invisible patterns thereon, one of said patterns being developable by a developer solution capable of developing said pattern only and all of said patterns being developable by a developer solution capable of developing all of said patterns collectively.

24. A drawing paper having a plurality of normally invisible patterns, one consisting of geometrically spaced figures containing one compound and another of figures containing a different compound and having definite relation to said first-named figures, said first compound being capable of development by a developer which does not develop the second compound and also by a second developer capable of developing said second compound.

25. A drawing paper having a plurality of normally invisible patterns, one of said patterns being developable by a developer solution capable of developing said pattern only and all of said patterns being developable by a developer solution capable of developing all of said patterns collectively.

MAURICE D. McINTOSH.